United States Patent
Dudar (10) Patent No.: US 11,111,867 B1
(45) Date of Patent: Sep. 7, 2021

(54) SYSTEMS AND METHODS FOR AN EVAPORATIVE EMISSIONS CONTROL SYSTEM

(71) Applicant: Ford Global Technologies, LLC, Dearborn, MI (US)

(72) Inventor: Aed Dudar, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 17/088,492

(22) Filed: Nov. 3, 2020

(51) Int. Cl.
| | |
|---|---|
| *F02D 41/00* | (2006.01) |
| *B60K 15/035* | (2006.01) |
| *H03K 5/1534* | (2006.01) |
| *H03K 5/24* | (2006.01) |
| *B60K 15/03* | (2006.01) |

(52) U.S. Cl.
CPC .......... *F02D 41/004* (2013.01); *B60K 15/035* (2013.01); *H03K 5/1534* (2013.01); *H03K 5/24* (2013.01); *B60K 2015/0348* (2013.01); *B60K 2015/03514* (2013.01); *F02D 2200/70* (2013.01)

(58) Field of Classification Search
CPC . F02D 41/004; F02D 2200/70; B60K 15/035; B60K 2015/0348; B60K 2015/03514; H03K 5/24; H03K 5/1534
See application file for complete search history.

(56) References Cited

U.S. PATENT DOCUMENTS

| | | | |
|---|---|---|---|
| 6,681,789 B1 | 1/2004 | Moulis et al. | |
| 10,018,158 B2 * | 7/2018 | Dudar | ................ F02M 25/0809 |
| 2009/0084363 A1 | 4/2009 | Reddy | |
| 2015/0158378 A1 * | 6/2015 | Dudar | .............. B60K 15/03519 701/22 |
| 2017/0226967 A1 * | 8/2017 | Dudar | .............. B60K 15/03504 |
| 2018/0320645 A1 * | 11/2018 | McQuillen | ............ F02D 41/144 |

* cited by examiner

*Primary Examiner* — Joseph J Dallo
(74) *Attorney, Agent, or Firm* — Geoffrey Brumbaugh; McCoy Russell LLP (57) ABSTRACT

Methods and systems are provided for reverse purging in a non-integrated refueling canister only system based on diurnal temperature variation. In one example, a method may include during a vehicle-off condition, in response to an estimated cooling of fuel in a fuel tank, unseal the fuel tank by pulsing a refueling valve (RV) to an open position. The cooling of the fuel may be estimated based on output of a first solar cell.

20 Claims, 6 Drawing Sheets

SYSTEMS AND METHODS FOR AN EVAPORATIVE EMISSIONS CONTROL SYSTEM

FIELD

The present description relates generally to methods and systems for a non-integrated refueling canister only system.

BACKGROUND/SUMMARY

A vehicle fuel system may include an evaporative emissions control system designed to reduce the release of fuel vapors to the atmosphere. For example, vaporized hydrocarbons (HCs) from a fuel tank may be stored in a fuel vapor storage canister packed with an adsorbent that adsorbs and stores the vapors. At a later time, when the engine is in operation, the fuel vapors may be purged from the evaporative emissions system into an engine intake manifold for use as fuel. In some examples, the evaporative emissions system may be configured to store refueling vapors, running loss vapor, and diurnal vapors. However, in other examples, the evaporative emissions system and fuel system may be configured as a non-integrated refueling canister only system (NIRCOS). In such a system, the fuel tank is sealed, and fuel vapors are only routed to the fuel vapor storage canister during a refueling event. For example, a plug-in hybrid electric vehicle (PHEV) may include a NIRCOS due to limited engine run time. If the fuel tank were vented, prolonged electric mode driving (in which the engine is off and the vehicle is propelled with torque from an electric motor) may result in the fuel vapor storage canister becoming overloaded and fuel vapors being emitted to the atmosphere. In order to seal the fuel tank from the fuel vapor storage canister, the NIRCOS may include a refueling valve (also referred as fuel tank isolation valve) between the fuel tank and the fuel vapor storage canister. The refueling valve may be at least partially opened to regulate fuel tank pressure during engine-on conditions and to prepare the fuel tank for refueling (e.g., during engine-off conditions).

Various approaches are shown for reducing load of fuel vapor in the fuel vapor storage canister. One example approach is shown by Reddy in U.S. 2009/0084363. Therein, in a hybrid vehicle, when engine operation is insufficient to purge fuel vapor from the canister to the combustion chambers, microwave energy from a microwave generator coupled to the canister via a wave guide is used to heat the fuel vapor storage canister to desorb the fuel vapor and route the vapor back through the fuel vapor vent line into the fuel tank. A vacuum pump in the vent line may assist the flow of the purged fuel vapor from the canister to the fuel tank.

However, the inventors herein have recognized potential issues with such systems. As one example, incorporation of components such as microwave generator, wave guide, vacuum pump to facilitate reverse purge of the canister may add to the cost of the engine and also increase packaging concerns. If the canister is not purged to the engine or reverse purged to the fuel tank over a prolonged duration of vehicle operation without engine operation, the canister may be overloaded causing detrimental effects on emissions compliance.

In one example, the issues described above may be addressed by a method for an engine in a vehicle, comprising: during a vehicle-off condition, in response to an estimated cooling of fuel in a fuel tank, opening a refueling valve (RV) to unseal the fuel tank, the estimated cooling of the fuel based on output of a first solar cell. In this way, reverse purging of the fuel vapor storage canister coupled to a NIRCOS fuel tank may be enabled based on diurnal change in temperature.

As one example, a refueling valve (RV) may be housed in a fuel vapor line coupling a NIRCOS fuel tank to the canister. The RV may be maintained at a closed position except during refueling and during purging the canister to the engine during engine operation. The RV may be actuated via a comparator circuit without interference from the controller. A solar cell may be configured on an external surface of the vehicle to monitor a change in solar radiance. A change in ambient light amount such as during sunrise and sunset may be detected based on output from the solar cell. During a higher than threshold load of the canister, upon detection of sunset, the RV may be pulsed to an open position to establish fluidic communication between the canister and the otherwise sealed fuel tank. The timing of opening of the RV may be further based on a fuel level in the fuel tank. Due to the lower ambient temperature after sunset, the fuel in the fuel tank may cool down and a lower pressure may be generated at the fuel tank. The lower pressure at the tank may draw in ambient air into the fuel tank via a vent line of the canister, the canister, and the RV. The flow of ambient air through the canister may desorb fuel vapors from the canister and route the fuel vapors back to the fuel tank. Upon detection of sunrise, the RV may be pulsed to a closed position to seal the fuel tank and inhibit fuel vapor flow between the fuel tank and the canister.

In this way, by using a solar cell, diurnal temperature variation may be detected and the RV may be opened to allow reverse purging of the canister. By facilitating reverse purging of the canister even during prolonged inactivity of the engine, overloading of the canister may be reduced and possibility of noncompliance with emissions standards may be reduced. The technical effect of using a compliance circuit for pulsing a RV upon detection of sunset/sunrise is that the PCM need not be awoken to carry out the reverse purging routine. By using the diurnal temperature variation, reverse purging may be carried out without any additional engine components, thereby reducing cost and packing concerns. Overall, by maintaining a lower than threshold loading in the canister of a hybrid vehicle, emissions quality and vehicle integrity may be improved.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1:
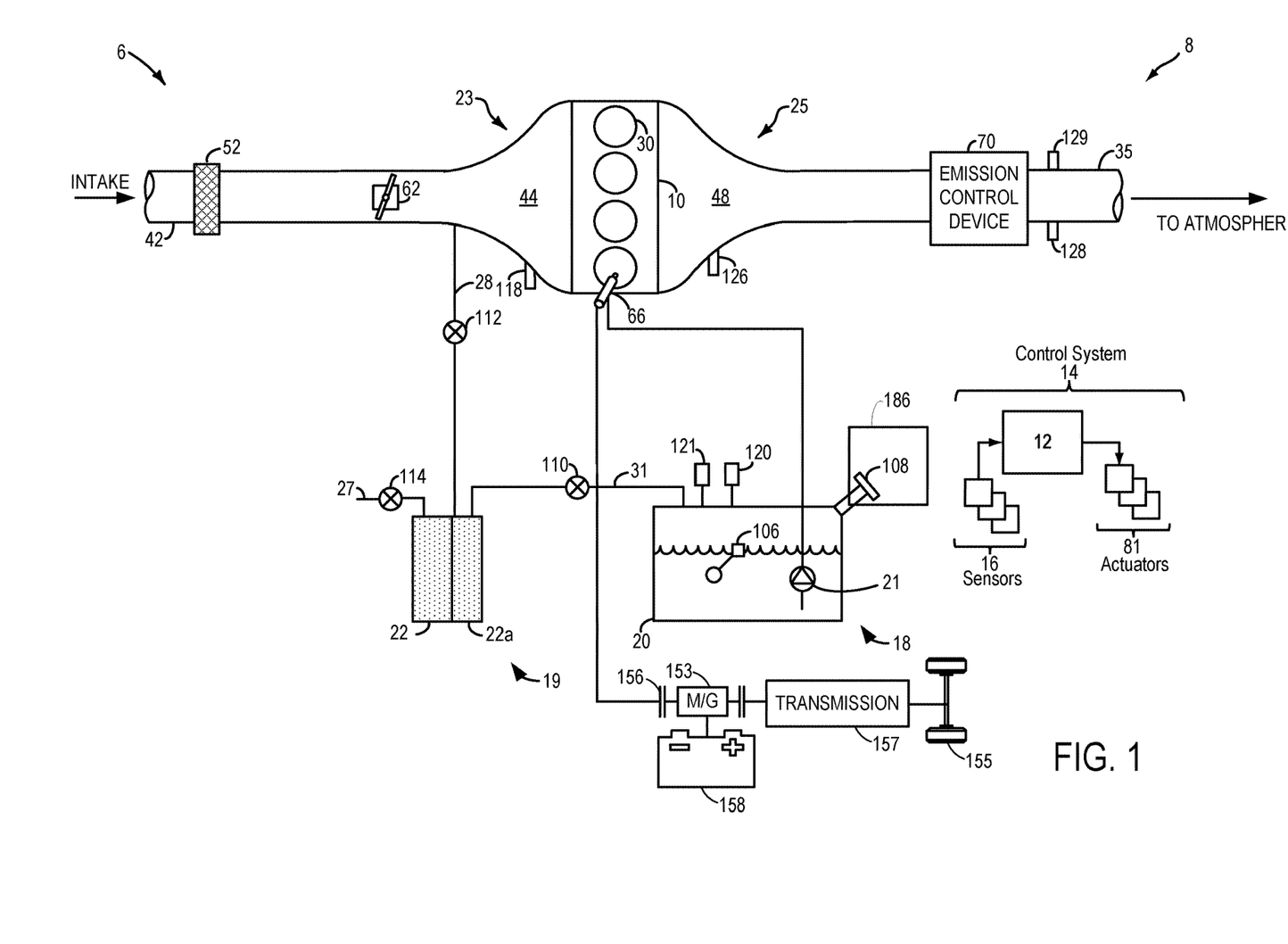
FIG. 1 shows a schematic depiction of engine coupled to an evaporative emissions control system configured as a non-integrated refueling canister only system.

The following description relates to systems and methods for reverse purging of a fuel vapor canister in an evaporative emission control (EVAP) system configured as non-integrated refueling canister only system (NIRCOS) as shown in FIG. 1. A reverse purge may be conducted based on an ambient light amount due to the fact that in absence of solar radiance (at night), temperature of the fuel tank may reduce. The heat gains and losses in the fuel tank may be directly proportional to a change in pressure in the fuel tank which facilitates the reverse purge of the canister. A change in ambient light amount (solar radiance) may be detected by solar cells mounted on a vehicle, such as the vehicle system illustrated in FIG. 2A. In order to detect a change in ambient light amount such as that of a sunrise or sunset event, an edge detector such as the edge detector illustrated in FIG. 2B with an exclusive (XOR) logic gate, may be utilized. Such an edge detector may be capable of sensing rising or falling edges corresponding to a sunrise or sunset event, respectively, where FIG. 2C illustrates the functionality of the edge detector depicted in FIG. 2B. Such an edge detector may be coupled to output from a solar cell, as illustrated by the circuit depicted in FIG. 3, where responsive to an indication of a rising or falling edge (sunrise or sunset event), a refueling valve of the fuel system may be actuated to initiate or suspend reverse purge of the canister. A controller may be configured to carry out a reverse purge of the canister based on methods shown in FIGS. 4 and 5. An example reverse purging of the canister by actuation of the RV based on output of a solar cell is shown in FIG. 6.

FIG. 1 shows a schematic depiction of a vehicle system 6 that can derive propulsion power from engine system 8. Engine system 8 may include an engine 10 having a plurality of cylinders 30. Engine 10 includes an engine intake 23 and an engine exhaust 25. Engine intake 23 includes an air intake throttle 62 fluidly coupled to the engine intake manifold 44 via an intake passage 42. Air may enter intake passage 42 via air filter 52. Engine exhaust 25 includes an exhaust manifold 48 leading to an exhaust passage 35 that routes exhaust gas to the atmosphere. Engine exhaust 25 may include one or more emission control devices 70 mounted in a close-coupled position. The one or more emission control devices may include a three-way catalyst, lean NOx trap, diesel particulate filter, oxidation catalyst, etc. It will be appreciated that other components may be included in the engine such as a variety of valves and sensors, as further elaborated in herein. In some embodiments, wherein engine system 8 is a boosted engine system, the engine system may further include a boosting device, such as a turbocharger (not shown).

Engine system 8 is coupled to a fuel system 18, and evaporative emissions system 19. Fuel system 18 includes a fuel tank 20 coupled to a fuel pump 21, the fuel tank supplying fuel to an engine 10 which propels the vehicle. Evaporative emissions system 19 includes fuel vapor canister 22. During a fuel tank refueling event, fuel may be pumped into the vehicle from an external source through refueling port 108.

Fuel tank 20 may hold a plurality of fuel blends, including fuel with a range of alcohol concentrations, such as various gasoline-ethanol blends, including E10, E85, gasoline, etc., and combinations thereof. A fuel level sensor 106 located in fuel tank 20 may provide an indication of the fuel level ("Fuel Level Input") to controller 12. As depicted, fuel level sensor 106 may comprise a float connected to a variable resistor. Alternatively, other types of fuel level sensors may be used.

Fuel pump 21 is configured to pressurize fuel delivered to the injectors of engine 10, such as example injector 66. While only a single injector 66 is shown, additional injectors are provided for each cylinder. It will be appreciated that fuel system 18 may be a return-less fuel system, a return fuel system, or various other types of fuel system. Vapors generated in fuel tank 20 may be routed to fuel vapor canister 22, via fuel vapor line 31, before being purged to the engine intake 23.

Fuel vapor canister 22 is filled with an appropriate adsorbent for temporarily trapping fuel vapors (including vaporized hydrocarbons) generated during fuel tank refueling operations, as well as diurnal vapors. In one example, the adsorbent used is activated charcoal. When purging conditions are met, such as when the canister is saturated, vapors stored in fuel vapor canister 22 may be purged to engine intake 23 by opening canister purge valve 112. While a single canister 22 is shown, it will be appreciated that fuel system 18 may include any number of canisters. In one example, canister purge valve 112 may be a solenoid valve wherein opening or closing of the valve is performed via actuation of a canister purge solenoid.

Canister 22 may include a buffer 22a (or buffer region), each of the canister and the buffer comprising the adsorbent. As shown, the volume of buffer 22a may be smaller than (e.g., a fraction of) the volume of canister 22. The adsorbent in the buffer 22a may be same as, or different from, the adsorbent in the canister (e.g., both may include charcoal). Buffer 22a may be positioned within canister 22 such that during canister loading, fuel tank vapors are first adsorbed within the buffer, and then when the buffer is saturated, further fuel tank vapors are adsorbed in the canister. In comparison, during canister purging, fuel vapors are first desorbed from the canister (e.g., to a threshold amount) before being desorbed from the buffer. In other words, loading and unloading of the buffer is not linear with the loading and unloading of the canister. As such, the effect of the canister buffer is to dampen any fuel vapor spikes flowing from the fuel tank to the canister, thereby reducing the possibility of any fuel vapor spikes going to the engine.

Canister 22 includes a vent 27 for routing gases out of the canister 22 to the atmosphere when storing, or trapping, fuel vapors from fuel tank 20. Vent 27 may also allow fresh air to be drawn into fuel vapor canister 22 when purging stored fuel vapors to engine intake 23 via purge line 28 and purge valve 112. While this example shows vent 27 communicating with fresh, unheated air, various modifications may also be used. Vent 27 may include a canister vent valve (CVV) 114 to adjust a flow of air and vapors between canister 22 and the atmosphere. The canister vent valve may also be used for diagnostic routines. When included, the vent valve may be opened during fuel vapor storing operations (for example, during fuel tank refueling and while the engine is not running) so that air, stripped of fuel vapor after having passed through the canister, can be pushed out to the atmosphere. Likewise, during purging operations (for example, during canister regeneration and while the engine is running), the vent valve may be opened to allow a flow of fresh air to strip the fuel vapors stored in the canister. In one example, canister vent valve 114 may be a solenoid valve wherein opening or closing of the valve is performed via actuation of a canister vent solenoid. In particular, the canister vent valve may be in an open position that is closed upon actuation of the canister vent solenoid.

As such, hybrid vehicle system 6 may have reduced engine operation times due to the vehicle being powered by engine system 8 during some conditions, and by the energy storage device under other conditions. While the reduced engine operation times reduce overall carbon emissions from the vehicle, they may also lead to insufficient purging of fuel vapors from the vehicle's emission control system. To address this, a refueling valve (also referred herein as fuel tank isolation valve) 110 may be optionally included in fuel vapor line 31 such that fuel tank 20 is coupled to canister 22 via the valve. During regular engine operation, refueling valve 110 may be kept closed to limit the amount of diurnal or "running loss" vapors directed to canister 22 from fuel tank 20. During refueling operations, and selected purging conditions, refueling valve 110 may be temporarily opened, e.g., for a duration, to direct fuel vapors from the fuel tank 20 to canister 22. Further, refueling valve 110 may also be temporarily opened when the fuel tank pressure is higher than a threshold (e.g., above a mechanical pressure limit of the fuel tank), such that fuel vapors may be released into the fuel vapor storage canister and the fuel tank pressure maintained below the threshold. While the depicted example shows refueling valve 110 positioned along fuel vapor line 31, in alternate embodiments, the isolation valve may be mounted on fuel tank 20.

The fuel tank 20 may be a sealed fuel tank included in a PHEV, such as part of a non-integrated refueling canister only system (NIRCOS), for example. When closed, the refueling valve 110 isolates the fuel system, including the fuel tank 20, from an evaporative emissions system, including a fuel vapor storage canister 22, which may be a "refueling only" fuel vapor storage canister 22. The fuel tank 20 may be made of heavy steel to withstand pressures and vacuum builds from diurnal temperature cycle. The canister 22 may be sized to primarily adsorb refueling and depressurization vapors. Running loss and diurnal vapors may be contained inside the fuel tank 20. A fuel door 186 may prevent access to refueling port 108 of the fuel tank 20 when in a closed position. Fuel door 186 may be normally locked in the closed position so that fuel door 186 may not be opened. Fuel door 186 may be unlocked during the fuel tank refueling event in response to a determination that fuel tank 20 is depressurized. When unlocked, fuel door 286 may be opened to enable access to refueling port 108. A desire to refuel may be indicated by an operator via a switch mounted on a dash board of the vehicle or via a mobile device (such as an application in a smart phone). In one example, once an upcoming refueling is indicated, the refueling valve 110 may be opened to vent the fuel tank 20, and upon the pressure in the fuel tank 20 reducing/increasing to atmospheric pressure, the fuel door 186 is opened to enable refueling.

Since the fuel tank 20 is sealed during prolonged operation of the vehicle in electric mode (without engine operation), reverse purging of fuel vapors from the canister 22 to the fuel tank 20 may not occur. Reverse purging may be defined as a flow of air from the vent 27 to the fuel tank 20 via the canister 22 during a lower than threshold pressure at the fuel tank 20, the flow of air desorbing fuel vapors from the canister 22 and routing the fuel vapors back to fuel tank 20. Due to diurnal temperature variation, a pressure in the fuel tank may decrease at night causing the lower than threshold pressure at the fuel tank 20. Reverse purging of the canister 22 allows a load in the canister to remain below a threshold thereby reducing the possibility of overloading and/or fuel vapor escaping to the vent from the canister 22. However, due to the refueling valve 110 being maintained in a closed position, reverse purging may not naturally occur.

Figure 3:
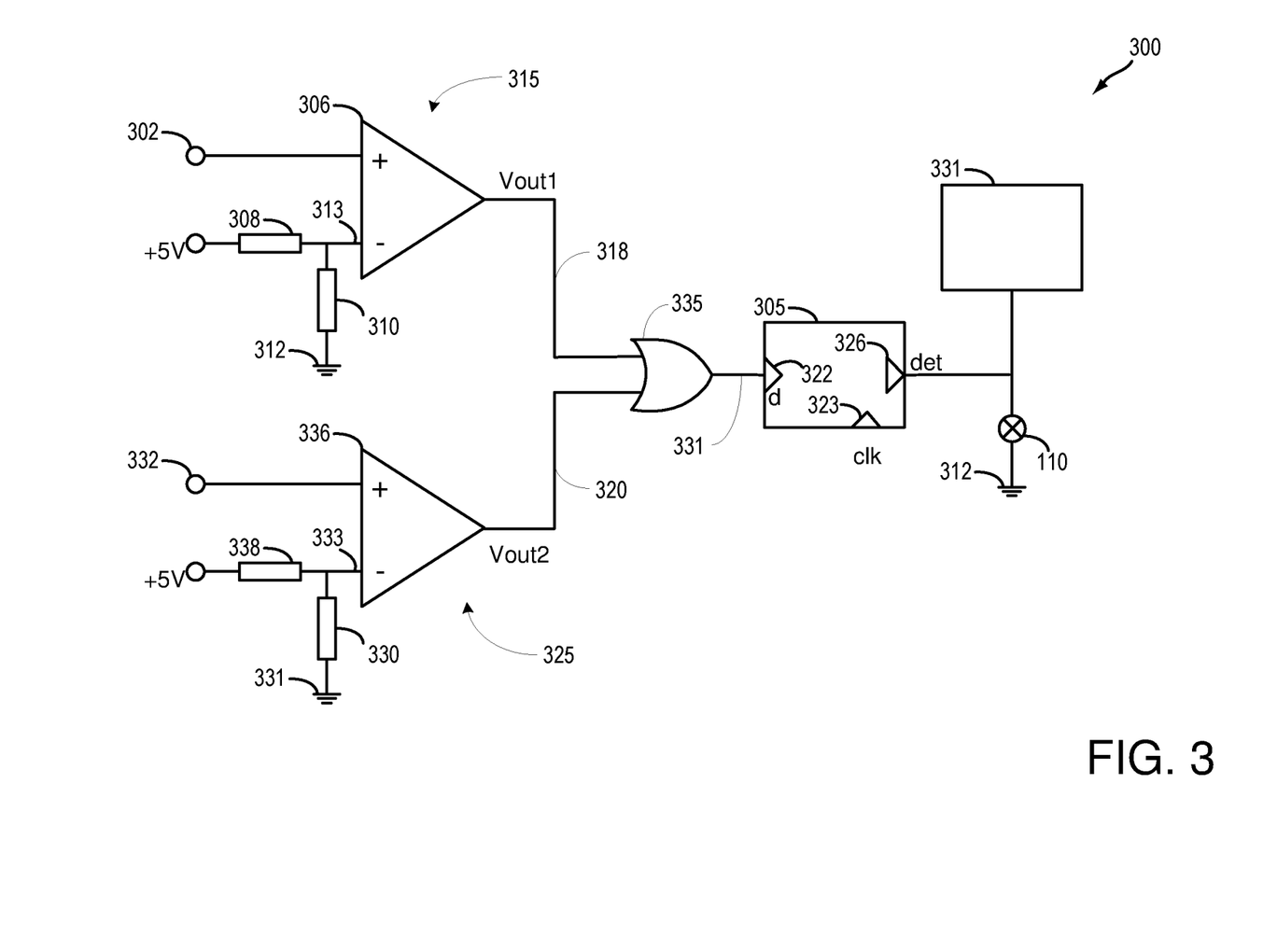
FIG. 3 show a schematic depiction of an example circuit diagram for actuating a refueling valve (RV) based on input from a solar cell.

During a vehicle off condition, in response to detection of sunset via a first solar cell, the RV 110 coupling the fuel tank 20 to the fuel vapor canister 22 of the evaporative emissions control system may be pulsed to an open position, and in response to detection of sunrise via a second solar cell, the RV 110 may be pulsed to a closed position. An output of the first solar cell and an output of the second solar cell may be configured as inputs to a comparator circuit, the comparator circuit including one or more operational amplifiers, resistors, variable resistors, and logic gates. The resistors may include each of a first variable resistor to delay opening the RV 110 by a first duration after sunset, and a second variable resistor to delay closing the RV 110 by a second duration after the sunrise. At a vehicle off event, each of a first value of the first variable resistor may be set and a second value of the second variable resistor may be set based on a fuel level in the fuel tank. The comparator circuit may be activated by a controller at the vehicle off event based on a higher than threshold fuel vapor load in the fuel vapor canister 22. The controller may be maintained inactive during operation of the comparator circuit during the vehicle off condition. Details of the comparator circuit is shown in FIG. 3. Upon opening of the RV 100, air is drawn into the fuel tank via a vent line 27 and the canister 22, the air desorbing fuel vapor from the canister 22 and routing the desorbed fuel vapor back to the fuel tank 20, thereby reverse purging the canister 22.

One or more pressure sensors 120 may be coupled to fuel system 18 for providing an estimate of a fuel system (and evaporative emissions system) pressure. In one example, the fuel system pressure, and in some example evaporative emissions system pressure as well, is indicated by pressure sensor 120, where pressure sensor 120 is a fuel tank pressure transducer (FTPT) coupled to fuel tank 20. While the depicted example shows pressure sensor 120 directly coupled to fuel tank 20, in alternate embodiments, the pressure sensor may be coupled between the fuel tank and canister 22, specifically between the fuel tank and refueling valve 110.

One or more temperature sensors 121 may also be coupled to fuel system 18 for providing an estimate of a fuel system temperature. In one example, the fuel system temperature is a fuel tank temperature, wherein temperature sensor 121 is a fuel tank temperature sensor coupled to fuel tank 20 for estimating a fuel tank temperature. While the depicted example shows temperature sensor 121 directly coupled to fuel tank 20, in alternate embodiments, the temperature sensor may be coupled between the fuel tank and canister 22.

Fuel vapors released from canister 22, for example during a purging operation, may be directed into engine intake manifold 44 via purge line 28. The flow of vapors along purge line 28 may be regulated by canister purge valve (CPV) 112, coupled between the fuel vapor canister and the engine intake. The quantity and rate of vapors released by the canister purge valve may be determined by the duty cycle of an associated canister purge valve solenoid (not shown). As such, the duty cycle of the canister purge valve solenoid may be determined by the vehicle's powertrain control module (PCM), such as controller 12, responsive to engine operating conditions, including, for example, engine speed-load conditions, an air-fuel ratio, a canister load, etc. By commanding the canister purge valve to be closed, the controller may seal the fuel vapor recovery system from the engine intake. The CPV 112 may be maintained in an open position. An optional canister check valve (not shown) may be included in purge line 28 to prevent intake manifold pressure from flowing gases in the opposite direction of the purge flow. An estimate of the manifold absolute pressure (MAP) or manifold vacuum (ManVac) may be obtained from MAP sensor 118 coupled to intake manifold 44, and communicated with controller 12. Alternatively, MAP may be inferred from alternate engine operating conditions, such as mass air flow (MAF), as measured by a MAF sensor (not shown) coupled to the intake manifold.

Fuel system 18 and evaporative emissions system 19 may be operated by controller 12 in a plurality of modes by selective adjustment of the various valves and solenoids. For example, the fuel system and evaporative emissions system may be operated in a refueling mode (e.g., when fuel tank refueling is requested by a vehicle operator), wherein the controller 12 may open refueling valve 110 and canister vent valve 114, while maintaining canister purge valve 112 closed, to depressurize the fuel tank before enabling fuel to be added therein. As such, refueling valve 110 may be kept open during the refueling operation to allow refueling vapors to be stored in the canister. After refueling is completed, the isolation valve may be closed.

In another example, the fuel system and evaporative emissions system may be operated in a canister purging mode (e.g., after an emission control device light-off temperature has been attained and with the engine running), wherein the controller 12 may open canister purge valve 112 and canister vent valve while closing refueling valve 110. Herein, the vacuum generated by the intake manifold of the operating engine may be used to draw fresh air through vent 27 and through fuel vapor canister 22 to purge the stored fuel vapors into intake manifold 44. In this mode, the purged fuel vapors from the canister are combusted in the engine. The purging may be continued until the stored fuel vapor amount in the canister is below a threshold. During purging, the learned vapor amount/concentration can be used to determine the amount of fuel vapors stored in the canister, and then during a later portion of the purging operation (when the canister is sufficiently purged or empty), the learned vapor amount/concentration can be used to estimate a loading state of the fuel vapor canister. For example, one or more oxygen sensors (not shown) may be coupled to the canister 22 (e.g., downstream of the canister), or positioned in the engine intake and/or engine exhaust, to provide an estimate of a canister load (that is, an amount of fuel vapors stored in the canister). Based on the canister load, and further based on engine operating conditions, such as engine speed-load conditions, a purge flow rate may be determined.

Vehicle system 6 may further include control system 14. Control system 14 is shown receiving information from a plurality of sensors 16 (various examples of which are described herein) and sending control signals to a plurality of actuators 81 (various examples of which are described herein). As one example, sensors 16 may include exhaust gas sensor 126 located upstream of the emission control device, temperature sensor 128, MAP sensor 118, pressure sensor 120, temperature sensor 121, oxygen sensors coupled to the canister 22, and pressure sensor 129. Other sensors such as additional pressure, temperature, air/fuel ratio, and composition sensors may be coupled to various locations in the vehicle system 6. As another example, the actuators may include fuel injector 66, refueling valve 110, purge valve 112, vent valve 114, fuel pump 21, and throttle 62.

Controller 12 may be configured as a conventional microcomputer including a microprocessor unit, input/output ports, read-only memory, random access memory, keep alive memory, a controller area network (CAN) bus, etc. Controller 12 may be configured as a powertrain control module (PCM). The controller may be shifted between sleep and wake-up modes for additional energy efficiency. The controller may receive input data from the various sensors, process the input data, and trigger the actuators in response to the processed input data based on instruction or code programmed therein corresponding to one or more routines. Example control routines are described herein with regard to FIGS. 5-6.

In some examples, vehicle system 6 may be a hybrid vehicle system with multiple sources of torque available to one or more vehicle wheels 155. In other examples, vehicle system 6 is a conventional vehicle with only an engine, or an electric vehicle with only electric machine(s). In the example shown, vehicle system 6 includes engine 10 and an electric machine 153. Electric machine 153 may be a motor or a motor/generator. Crankshaft of engine and electric machine 153 are connected via a transmission 157 to vehicle wheels 155 when one or more clutches 156 are engaged. In the depicted example, a first clutch 156 is provided between crankshaft and electric machine 153, and a second clutch 156 is provided between electric machine 153 and transmission 157. Controller 12 may send a signal to an actuator of each clutch 156 to engage or disengage the clutch, so as to connect or disconnect crankshaft from electric machine 153 and the components connected thereto, and/or connect or disconnect electric machine 153 from transmission 157 and the components connected thereto. Transmission 157 may be a gearbox, a planetary gear system, or another type of transmission. The powertrain may be configured in various manners including as a parallel, a series, or a series-parallel hybrid vehicle.

Electric machine 153 receives electrical power from a traction battery 158 to provide torque to vehicle wheels 155. Electric machine 153 may also be operated as a generator to provide electrical power to charge battery 158, for example during a braking operation.

Figure 2A:
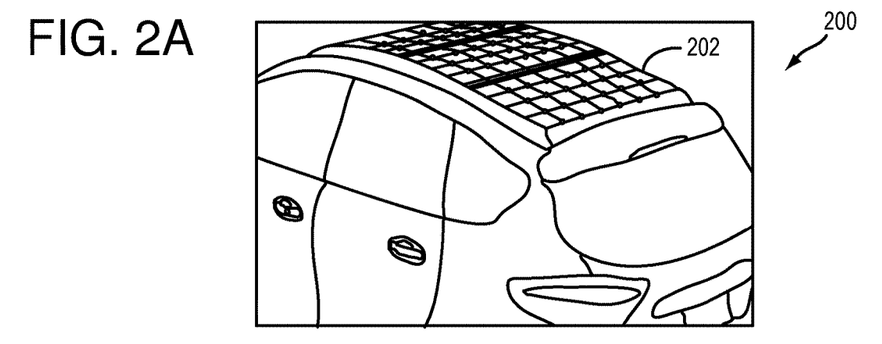
FIG. 2A shows a schematic depiction of a vehicle with a solar cell array mounted on the top of the vehicle.

FIG. 2A shows an example vehicle system 200, with a solar roof 202 existing on the vehicle (e.g., Ford CMAX). As such, in an example where a vehicle is equipped with a solar roof 202, the solar roof may be configured to sense sunrise or sunset events, whereupon such an indication may be utilized to open a refueling valve of the fuel system. However, while a solar roof is depicted in FIG. 2A, such an example is not meant to be limiting in any way, and any solar cell capable of detecting sunrise and/or sunset events and conveying the information to a controller (e.g., 12) of a vehicle may be utilized without departing from the scope of the present disclosure.

Figure 2B:
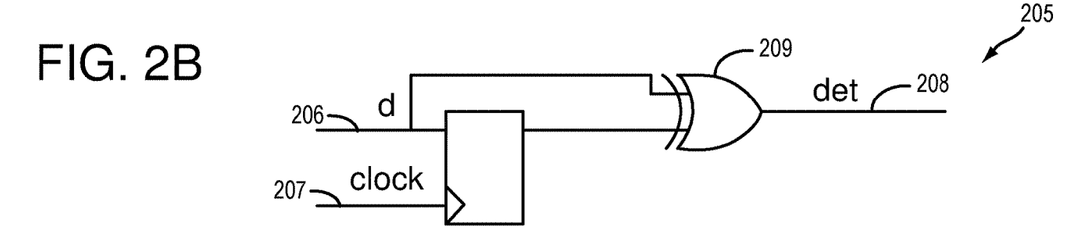
FIG. 2B shows a schematic depiction of an edge detector circuit.
Figure 2C:
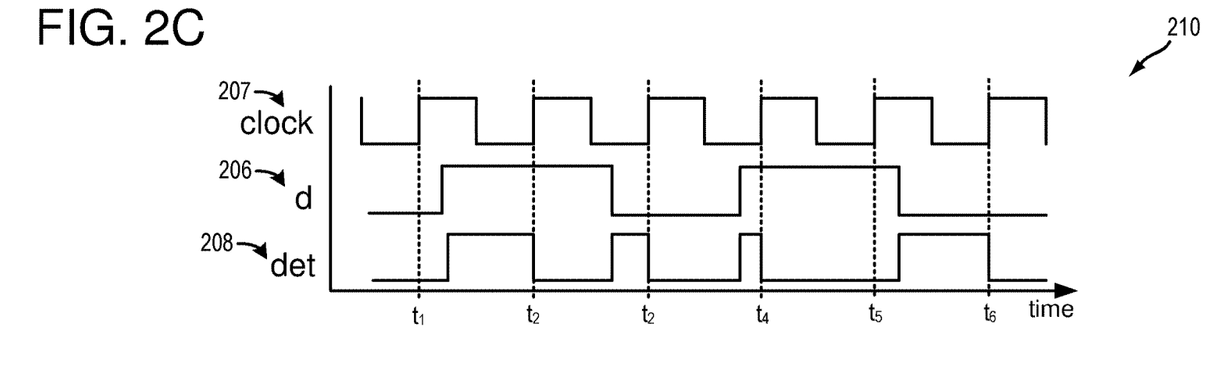
FIG. 2C shows an example timeline illustrating the functionality of an edge detector circuit.

To sense sunrise or sunset events, output voltage from a solar cell such as that depicted in FIG. 2A, may be processed by an edge detector, such as edge detector 205. Such an example edge detector 205 may include input (d) 206, where input (d) 206 comprises the output voltage from the solar cell. Such an example edge detector 205 may further include a clock input 207, where clock input 207 determines how often the input (d) 206 will be sampled. Such an example edge detector 205 may further include output (det) 208, which may pulse high when an edge is detected on the input (d) 206. Edge detector 205 may further include an exclusive OR (XOR) logic gate 209, such that edge detector 205 may detect both rising and falling edges, where a rising edge may correspond to a sunrise event, and where a falling edge may correspond to a sunset event, for example. Functionally, edge detector 205 may store the state of the signal at the last rising clock edge, and compare it to a current value of the input (d) 206. If a state change matches either a rising edge or a falling edge, the output (det) 208 may go high until the next rising clock edge. As will be described in further detail below, responsive to the output (det) 208 going high as a result of a rising or falling edge, a refueling valve of the fuel system may be opened/sealed to enable reverse purging of a canister of the evaporative emissions control system.

FIG. 2C depicts a sample set of waveforms 210 to illustrate the functionality of edge detector 205. Depicted is clock input 207, input (d) 206, and output (det) 208. As shown, rising clock edges are illustrated at time t1, t2, t3, t4, t5, and t6. Between time t1 and t2, input (d) 206 indicates a rising edge. Accordingly, output (det) 208 pulses high. However, at time t2, at the next rising clock edge, output (det) 208 is cleared. Between time t2 and t3, input (d) 206 indicates a falling edge. Accordingly, output (det) 208 again pulses high, and is cleared at time t3, corresponding to the next rising clock edge. Again, between time t3 and t4, input (d) 206 indicates a rising edge, as such, output (det) 208 pulses high, and is cleared at the next rising clock edge at time t4. Between time t4 and t5, input (d) 206 does not indicate a rising or falling edge. Accordingly, output (det) 208 does not pulse high between time t4 and t5. Between time t5 and t6, input (d) 206 indicates a falling edge. Again, output (det) 208 pulses high, and output (det) 208 is subsequently cleared at the next rising clock edge at time t6. It may be understood that FIG. 2C is shown for illustrative purposes only, to illustrate functionality of edge detector 205 illustrated in FIG. 2B. As discussed above, such an edge detector may be utilized to detect sunrise or sunset events, in order to actuate a refueling valve.

Turning now to FIG. 3, an example diagram of a comparator circuit 300 is illustrated, depicting how output from one or more solar cells may be utilized to trigger actuation of a refueling valve 110 (such as RV 110 in FIG. 1) during vehicle-off conditions in order to facilitate reverse purging of fuel vapor from an EVAP system canister (such as canister 22 in FIG. 1) to a fuel tank (such as fuel tank 20 in FIG. 1). The circuit 300 may include a sunrise circuit 315 to detect an increase in solar radiance (corresponding to the time when the sun rises) and a sunset circuit 325 to detect a decrease in solar radiance (corresponding to the time when the sun sets). The circuit 300 may be enabled via the controller 331 upon conditions for reverse purging being met. The conditions for reverse purging may include a vehicle-off condition with a higher than threshold canister loading. As an example, upon detection of a higher than threshold canister loading, the controller 331 may enable the circuit 300 to selectively actuate the RV 110 based on solar radiance and a fuel level in the fuel tank.

The sunrise circuit 315 may include a first operation amplifier 306 receiving a non-inverting input (+) from a first solar cell sensor 302 (Vs1) and an inverting input (−) from a voltage source (e.g., +5V), coupled to a first resistor (R1) 308, and a second resistor (R2) 310 in series, and further coupled to ground 312. The resistors R1 and R2 are selected to control a hysteresis between when the sun rises and the RV is actuated to a closed position (fuel tank sealed). R1 may be a fixed resistor (unchangeable resistance) corresponding to a first sunrise threshold while R2 may be a variable resistor, the resistance of which may be set by the controller. There may be a first difference in time between the sunrise and an increase in fuel temperature in the fuel tank and consequent fuel vapor generation and increase in fuel tank pressure. This first difference in time may be accounted for by adjusting the variable resistor R2. Due to the thermal mass of liquid fuel in the fuel tank, the higher the fuel level in the tank, the longer time it may take for the fuel to heat up after sunrise. Hence, at a higher fuel level in the tank, the closing of the RV may be delayed relative to the timing of closing the RV after sunrise for a lower fuel level. The value of R2 may be inversely proportional to the fuel level in the tank with R2 being set lower when the fuel level is higher and R2 being set higher when the fuel level is lower.

A first reference voltage (Vref1) 313 may comprise the inverting input (−), where Vref1 313 is defined by a simple voltage divider equation (1)

$$V_{ref1} = 5 * \frac{R2}{R1 + R2}$$

(1)

The output voltage, Vout1 318 from the first operation amplifier 306 may be based on the voltage of the first solar cell (Vs1) and the first reference voltage (Vref1) as given by equation (2).

$$V_{out1} = V_{s1} - V_{ref1} \quad (2)$$

Similarly, the sunset circuit 325 may include a second operation amplifier 336 receiving a non-inverting input (+) from a second solar cell sensor 332 (Vs2) and an inverting input (−) from a voltage source (e.g., +5V), coupled to a third resistor (R3) 338, and a fourth resistor (R4) 330 in series, and further coupled to ground 331. In one example, a single solar cell may be coupled to each of the first operation amplifier 306 and the second operation amplifier 336. The resistors R3 and R4 are selected to control a hysteresis between when the sun sets and the RV is actuated to an open position (reverse purging from canister to fuel tank enabled). R3 may be a fixed resistor (unchangeable resistance) corresponding to a second sunset threshold while R4 may be a variable resistor, the resistance of which may be set by the controller. There may be a second difference in time between the sunset and a decrease in fuel temperature in the fuel tank and consequent decrease in fuel tank pressure. This second difference in time may be accounted for by adjusting the variable resistor R4. Due to the thermal mass of liquid fuel in the fuel tank, the higher the fuel level in the tank, the longer time it may take for the fuel to cool down after sunset. Hence, at a higher fuel level in the tank, the opening of the RV may be delayed relative to the timing of opening the RV after sunrise for a lower fuel level. The value of R4 may be inversely proportional to the fuel level in the tank with R4 being set lower when the fuel level is higher and R4 being set higher when the fuel level is lower.

A reference voltage (Vref2) 333 may comprise the inverting input (−), where Vref2 333 is defined by a simple voltage divider equation (3)

$$V_{ref2} = 5 * \frac{R4}{R3 + R4}$$

(3)
The output voltage, Vout2 320 from the second operation amplifier 336 may be based on the voltage of the second solar cell (Vs2) and the second reference voltage (Vref2) as given by equation (4).

$$V_{out2} = V_{s2} - V_{ref2}$$

Each of the Vout1 318 and Vout2 320 may be inputs to an OR logic gate 335 where Vout1 318 or Vout2 320 may be used as input for an edge detector 305. Edge detector 305 may comprise an edge detector such as edge detector 205 described above with regard to FIG. 2B. More specifically, Vout1 318 or Vout2 320 may comprise the input (d) 322 to edge detector 305. Edge detector 305 may include a clock input 323, which may determine the frequency at which the input (d) 322 is sampled. Edge detector output (det) 326 may be coupled to a recirculation valve (RV) coupled to ground 312.

Edge detector 305 may comprise an XOR logic gate, such as that described above with regard to FIG. 2B, such that edge detector 305 may detect both rising and falling edges, where a rising edge may correspond to a sunrise event, and where a falling edge may correspond to a sunset event, or vice versa. Responsive to edge detector output (det) 305 pulsing high in response to a sunrise or sunset event, the RV may be actuated to a closed or open position to allow/inhibit fluidic communication between the canister and the fuel tank. Upon opening of the RV, air is drawn into the fuel tank via a vent line and the canister. The air may desorb fuel vapor from the canister and route the desorbed fuel vapor to the fuel tank, thereby reducing the fuel vapor load on the canister and reverse purging the canister. Details of the reverse purge process is described in relation FIGS. 4 and 5.

In this way, the systems in FIGS. 1-3 enable a system for an engine in a vehicle, comprising: a controller with computer-readable instructions stored on non-transitory memory that when executed cause the controller to: in response to a request for a vehicle off, estimate a load in a fuel vapor canister of an evaporative emissions control system; and in response to a higher than threshold load in the fuel vapor canister, activate a comparator circuit to open a refueling valve (RV) regulating flow of fuel vapor between a fuel tank and the fuel vapor canister in response to a decrease in solar radiance as detected via a first solar cell configured on a surface of the vehicle.

Figure 4:
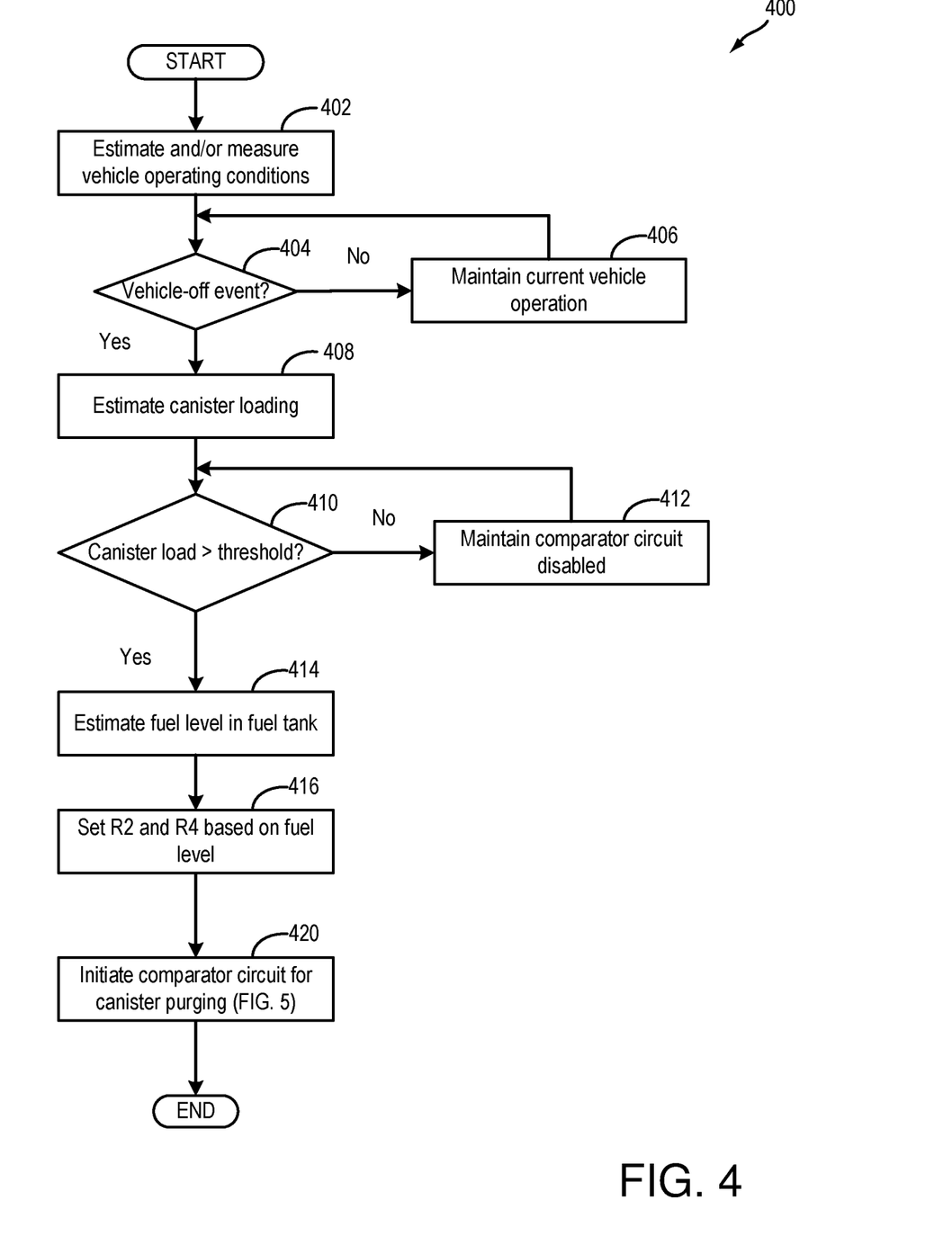
FIG. 4 shows a flow-chart of a first example method for initiating reverse purge of a fuel vapor canister based on output from solar cells.

FIG. 4 shows a flow-chart of a first example method 400 for initiating reverse purge of a fuel vapor canister based on output from solar cells. Reverse purging includes directing fuel vapor from the fuel vapor canister to the fuel tank during cooler and lower pressure at the fuel tank. Instructions for carrying out method 400 and the rest of the methods included herein may be executed by the controller based on instructions stored on a memory of the controller and in conjunction with signals received from sensors of the engine system, such as the sensors described above with reference to FIGS. 1-3.

Method 400 begins at 402 and includes estimating current vehicle and engine operating conditions. Operating conditions may be estimated, measured, and/or inferred, and may include one or more vehicle conditions, such as vehicle speed, vehicle location, etc., various engine conditions, such as engine status, engine load, engine speed, A/F ratio, etc., various fuel system conditions, such as fuel level, fuel type, fuel temperature, etc., various evaporative emissions system conditions, such as fuel tank pressure, etc., as well as various ambient conditions, such as ambient temperature, humidity, barometric pressure, etc.

At 402, the routine includes determining if a vehicle-off event has occurred. The vehicle-off event may include a key-off event following which the vehicle is no longer propelled via engine torque and/or motor torque. The vehicle off event may be indicated by an operator by actuation of a key, a fob, and/or via a wireless device such as a smart phone connected to the controller. The vehicle may be stationary (such as parked) following the off event. The vehicle-off event may follow a vehicle run time duration, the vehicle run time duration commencing at a previous vehicle-on event. If it is determined that a vehicle off event has not occurred, at 406, current vehicle operation may be continued without initiation of reverse purging.

If it is determined that a vehicle off event has occurred and the vehicle is not being propelled via engine torque or motor torque, at 408, load of a fuel vapor canister (such as canister 22 in FIG. 1) of the EVAP system may be estimated. Load of a canister is an amount of fuel vapor stored in the canister. In one example, the canister load may be estimated based on a first time elapsed since an immediately previous purge event wherein fuel vapor from the canister was routed to the engine for combustion. The canister load is further estimated based on a duration of opening of the refueling valve (such as refueling valve 110 in FIG. 1) such as during a refueling event following the immediately previous purge event to allow flow of fuel vapor from the fuel tank to the canister thereby increasing canister load. In another example, during purging, an estimated vapor amount/concentration can be used to determine the amount of fuel vapors stored in the canister, and then during a later portion of the purging operation (when the canister is sufficiently purged or empty), the estimated vapor amount/concentration can be used to estimate a loading state of the fuel vapor canister. In yet another example, canister load may be estimated based on outputs of one or more oxygen sensors coupled to the canister (e.g., downstream of the canister), or positioned in the engine intake and/or engine exhaust, to provide an estimate of a canister load.

At 410, the routine includes determining if the canister load is higher than a threshold load. The threshold load may correspond to a load above which fuel vapor may escape the canister via the vent line. Therefore, it is desirable to reduce the load of the canister once the canister load reaches the threshold load. In one example, the threshold load may be between 70%-90% of the total capacity of the canister. If it is determined that the canister load is not above the threshold load, it may be inferred that the canister may adsorb more fuel vapors and removal of fuel vapor may not be desired. Therefore, at 412, the comparator circuit (such as comparator circuit 300 in FIG. 3) may be maintained disabled. The RV is not pulsed open/closed based on diurnal temperature variation captured based on output of one or more solar cells.

If it is determined that the canister load is above the threshold load, it may be inferred that removal of fuel vapor from the canister may be desired. At 414, a fuel level in the fuel tank may be estimated via a fuel level sensor (such as fuel level sensor 106 in FIG. 1) located in the fuel tank. At 416, a first variable resistor R2 of a sunrise circuit (such as sunrise circuit 315 in FIG. 3) and a second variable resistor R4 of a sunset circuit (such as a sunset circuit 325 in FIG. 3) may be set based on the estimated fuel level in the fuel tank. The values of each of R2 and R4 may be inversely proportional to the fuel level in the tank with R2 and R4 being set lower when the fuel level is higher and R2 and R4 being set higher when the fuel level is lower. In one example, the controller may use a look-up table to determine the values of R2 and R4 with the fuel level as input and R2 and R4 as outputs. As an example, the value of R2 may be 100 ohms at higher fuel level and 1000 Ohms at lower fuel level, and the value of R4 may be 100 ohms at higher fuel level and 1000 Ohms at lower fuel level. The values of R1 and R3 (in FIG. 3) may be 9000 Ohms.

At 420, the comparator circuit may be initiated to enable reverse purging of the canister. Also, if a canister purge valve (CPV) is in a closed position, the CPV may be actuated to an open position. After sunset, due to reduction in ambient temperature, as fuel in the fuel tank cools down, the pressure in the fuel tank may reduce and fuel vapors may no longer be formed within the tank. The RV may be pulsed open during this cooler conditions to route ambient air into the fuel tank through the canister. As the air flows through the canister, fuel vapor is desorbed from the canister and purged to the fuel tank. After sunrise, the ambient temperature and consequently the fuel tank temperature may increase thereby increasing the pressure in the fuel tank. Also, the increase in temperature may vaporize fuel in the fuel tank. The RV may be pulsed closed during the warmer conditions to limit the possibility fuel vapors escaping to the atmosphere via the vent line. The comparator circuit used for pulsing the RV open and closed is described in FIG. 3. Details of the actuation of the RV is shown in FIG. 5.

Figure 5:
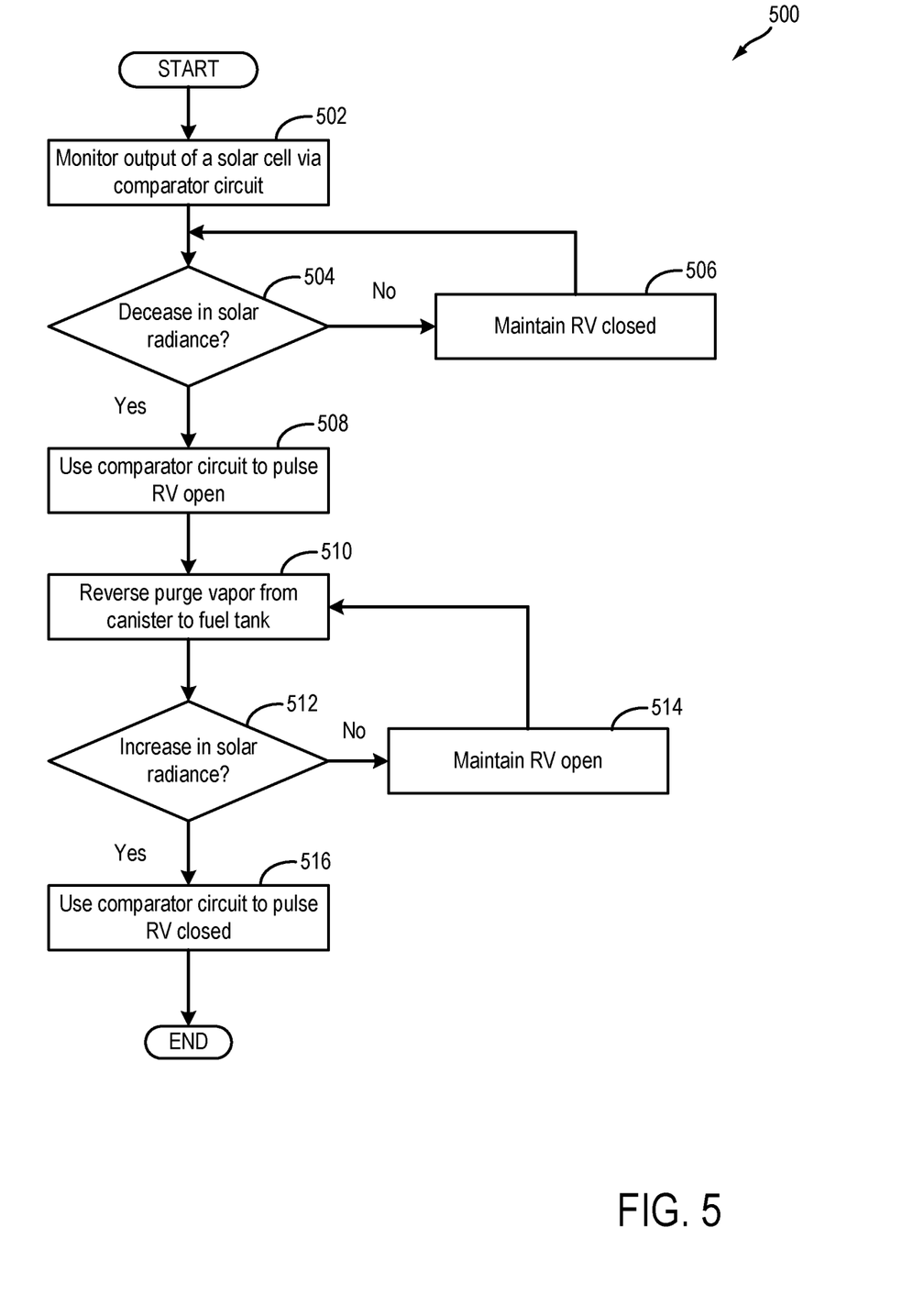
FIG. 5 shows a flow-chart of a second example method for actuating the RV for reverse purge of the fuel vapor canister.
Figure 6:
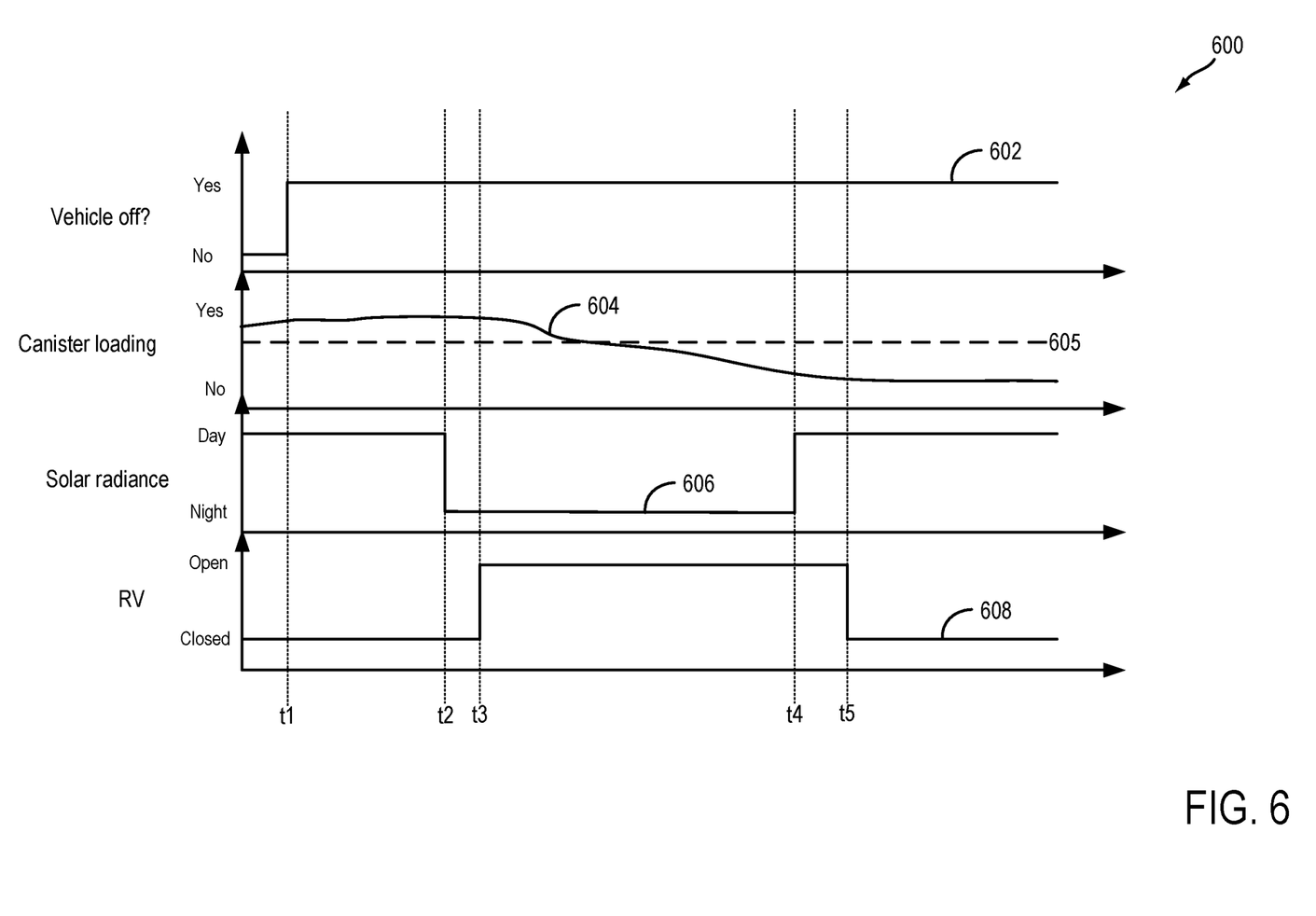
FIG. 6 shows an example actuation of the RV based on input from a solar cell.

FIG. 5 shows an example method 500 for actuating a refueling valve (such as RV 110 in FIG. 1) regulating flow of fuel vapor between a fuel tank and an EVAP system fuel vapor canister for reverse purge of the fuel vapor canister. Method 500 may be part of method 400 (in FIG. 4) and may be carried out in step 420 of FIG. 4. Method 500 may be carried out with the controller (Powertrain Control Module) inactive (sleeping) such as during a vehicle-off condition without intervention from the controller.

At 502, an output of a solar cell may be monitored via a comparator circuit (such as comparator circuit 300 in FIG. 3). The comparator circuit may be a "hot at all time (HAAT)" circuit. The comparator circuit may include a sunrise circuit including a first operation amplifier and a sunset circuit including a second operation amplifier. In one example, as described in details in FIG. 3, the first operation amplifier of the sunrise circuit may receive an input from a first solar cell sensor and the second operation amplifier of the sunset circuit may receive an input from a second solar cell sensor.

At 504, the routine includes determining if a decrease in solar radiance is observed. A decrease in solar radiance is observed after sunset as detected via the second solar cell sensor coupled to the sunset circuit. If it is determined that a decrease in solar radiance is not observed, at 506, the RV may be maintained in a closed position such that the fuel tank is sealed and isolated from the canister and a vent line leading to the atmosphere from the canister.

If it is determined that a decrease in solar radiance is observed, at 508, the comparator circuit may pulse the RV to an open position. There may be difference in time between the sunset and the opening of the RV to account for a thermal mass of fuel in the fuel tank. Due to the thermal mass of liquid fuel in the fuel tank, the higher the fuel level in the tank, the longer time it may take for the fuel to cool down after sunset. If the RV is opened before the fuel in the fuel tank has cooled down, fuel vapor from the fuel tank may escape to the vent line without being adsorbed in the canister that is loaded above the threshold load. The difference in time (first duration) between the sunset and the opening of the RV may be a function of the fuel level in the fuel tank. Variable resistors in the comparator circuit (such as resistors R2 310 and R4 330 in FIG. 3) may be adjusted based on the fuel level. The variable resistors allow the RV to be pulsed opened after a first duration of the sunrise. By opening the RV after the first duration has elapsed since sunset, it may be ensured that the fuel in the tank has cooled down and fuel tank is devoid of fuel vapors.

At 510, reverse purge of fuel vapor from the fuel vapor canister to the fuel tank may be carried out. Due to the decrease in temperature in the fuel tank and in absence of agitation of fuel in the fuel tank (such as during fuel sloshing while the vehicle is being operated), the pressure in the fuel tank may reduce. The reduced pressure in the fuel tank may cause air to be drawn into the fuel tank through the vent line (such as vent line 27 in FIG. 1), an open canister vent valve (such as CVV in FIG. 1), and the fuel vapor canister. As the fresh air flows through the canister, fuel vapor is desorbed from the canister and routed (with the air) to the fuel tank where it may condense into liquid fuel. As fuel vapor is removed from the canister, the fuel vapor load in the canister may reduce.

At 512, the routine includes determining if an increase in solar radiance is observed. An increase in solar radiance is observed after sunrise as detected via the first solar cell sensor coupled to the sunrise circuit. If it is determined that an increase in solar radiance is not observed, at 514, the RV may be maintained in an open position and reverse purging of the canister may be continued.

If it is determined that an increase in solar radiance is observed, at 516, the comparator circuit may pulse the RV to a closed position. There may be difference in time between the sunrise and the closing of the RV to account for a thermal mass of fuel in the fuel tank. Due to the thermal mass of liquid fuel in the fuel tank, the higher the fuel level in the tank, the longer time it may take for the fuel to heat up after sunrise. If the RV is closed before the fuel in the fuel tank has started heating up and fuel vapor generation is possible, reverse purging may be disabled without being able to maximize the amount of fuel vapor that may be purged from the canister back to the fuel tank. The difference in time (second duration) between the sunrise and the opening of the RV may be a function of the fuel level in the fuel tank. Variable resistors in the comparator circuit (such as resistors R2 310 and R4 330 in FIG. 3) may be adjusted based on the fuel level. The variable resistors allow the RV to be pulsed closed after a second duration following the sunset. By closing the RV after the second duration has elapsed since sunrise, it may be ensured that a higher amount of fuel vapor has been removed from the canister, thereby reducing canister load.

FIG. 6 shows an example 600 of actuation of a refueling valve (such as RV 110 in FIG. 1) coupled between a fuel tank (such as fuel tank 20 in FIG. 1) and a fuel vapor canister (such as canister 22 in FIG. 1) of an evaporative emissions control system based on input from a solar cell. The evaporative emissions system and fuel system may be configured as a non-integrated refueling canister only system (NIRCOS). The horizontal (x-axis) denotes time and the vertical markers t1-t5 identify significant times in the routine for RV actuation.

The first plot, line 602, denotes a vehicle-off condition when the vehicle is not being operated (such as propelled) using engine torque or motor torque. The second plot, line 604, denotes a load of the fuel vapor canister as estimated based on each of a first time elapsed since an immediately previous purge event wherein fuel vapor from the canister was routed to the engine for combustion and a duration of opening of the RV such as during a refueling event following the immediately previous purge event to allow flow of fuel vapor from the fuel tank to the canister thereby increasing canister load. Dashed line 605 denotes a threshold canister vapor load above which the RV will be actuated based on inputs from a solar cell. The threshold load 605 corresponds to a load above which fuel vapor may escape the canister via the vent line. The third plot, line 606, denotes solar radiance as monitored based on inputs from a solar cell coupled to the vehicle. The solar radiance changes upon sunrise and sunset. The fourth plot, line 608, denotes a position of the RV.

Prior to time t1, the vehicle is operated using engine torque and/or machine torque. The RV is maintained closed to limit flow of fuel vapors between the fuel tank and the canister. The canister load remains substantially equal since the canister is not being purged and/or fuel vapor from the fuel tank is not being routed to the canister. At time t1, the vehicle is keyed-off and no longer operated. In response to the higher than threshold canister load at key-off, the controller of the vehicle can initiate a comparator circuit (such as circuit 300 in FIG. 3) to infer solar radiance and opportunistically open the RV to facilitate reverse purging of the canister. The controller can than sleep (inactive state). From time t1 onwards, the vehicle is parked at a location. Based on input from the solar cell, it is inferred that between time t1 and t2, solar radiance is high such as during the day. The RV is maintained closed to restrict flow of fuel vapor to the vent line.

At time t2, in response to a drop in solar radiance, a sunset event is detected by the solar cells coupled to the comparator circuit. Upon detection of sunset, during a first duration of time, such as the time between t2 and t3, the fuel in the fuel tank cools down and fuel vapors inside the fuel tank condenses. The first duration of time is governed by one or more resisters in the comparator circuit, the resisters adjusted by the controller at key-off based on a fuel level in the fuel tank.

At time t3, the RV is pulsed to an open position. At the open position, fluidic connection is established between a vent line (such as vent line 27 in FIG. 1), the canister, and the fuel tank. Due to condensation of fuel vapor and the lower temperature at the fuel tank, a lower pressure is generated at the fuel tank causing ambient air to be sucked into the fuel tank from the vent line via the canister. As ambient air flows through the canister, fuel vapor is desorbed from the canister and routed to the fuel tank. Between time t3 and t4, as fuel vapor is desorbed from the canister, the canister load decreases steadily and reduces to below the threshold load 605.

At time t4, in response to an increase in solar radiance, a sunrise event is detected by the solar cells coupled to the comparator circuit. Upon detection of sunrise, during a second duration of time, such as the time between t4 and t5, the fuel in the fuel tank will warm up and start vaporizing. The second duration of time is governed by one or more resisters in the comparator circuit, the resisters adjusted by the controller at key-off based on a fuel level in the fuel tank. Reverse purging of the canister is continued during the second duration since fuel vapor has not sufficiently formed to escape to the atmosphere via the vent line.

At time t5, the RV is pulsed to the closed position to inhibit flow of fuel vapors between the fuel tank and the canister. Even as the vehicle is not being operated, during higher solar radiance conditions, the RV is maintained in a closed position to avert fuel vapor generated (due to the fuel being warmed by solar heat) from escaping to the atmosphere.

In this way, by opportunistically pulsing the RV to an open position based on a change in solar radiance and a canister load level, fuel vapor from the canister may be desorbed and routed back to the fuel tank. The technical effect of using a compliance circuit for pulsing the RV based on solar radiance is that the PCM need not be awoken to carry out the reverse purging routine. By carrying out reverse purging of the canister, overloading of the canister may be reduced and possibility of noncompliance with emissions standards may be reduced. Overall, by maintaining a lower than threshold loading in the canister of a hybrid vehicle, emissions quality and vehicle integrity may be improved.

In one example, a method for an engine in a vehicle, comprising: during a vehicle-off condition, in response to an estimated cooling of fuel in a fuel tank, opening a refueling valve (RV) to unseal the fuel tank, the estimated cooling of the fuel based on output of a first solar cell. In the preceding example, the method further comprising, additionally or optionally, in response to an estimated warming of the fuel in the fuel tank, closing the RV to seal the fuel tank, the estimated warming based on output of a second solar cell. In any or all of the preceding examples, additionally or optionally, the RV is coupled to a fuel vapor line regulating flow of fuel vapor between the fuel tank and a canister of an evaporative emissions control (EVAP) system. In any or all of the preceding examples, additionally or optionally, upon opening of RV, air is drawn into the fuel tank via a vent line and the canister, the air desorbing fuel vapor from the canister and routing the desorbed fuel vapor to the fuel tank. In any or all of the preceding examples, additionally or optionally, the opening of the RV and the closing of the RV is carried out via a comparator circuit activated by a controller at an onset of the vehicle off condition in response to a higher than threshold load in the canister, wherein each of the first solar cell and the second solar cell are configured on an external surface of the vehicle. In any or all of the preceding examples, additionally or optionally, the comparator circuit includes a first operational amplifier configured to receive a first non-inverting input from the second solar cell and a first inverting input from a first voltage source coupled to each of a first resistor and a second resistor in series. In any or all of the preceding examples, additionally or optionally, the comparator circuit further includes a second operational amplifier configured to receive a second non-inverting input from the first solar cell and a second inverting input from a second voltage source coupled to each of a third resistor and a fourth resistor in series. In any or all of the preceding examples, additionally or optionally, each of the second resistor and the fourth resistor are variable resistors, and wherein each of the first resistor and the third resistor are fixed resistors. In any or all of the preceding examples, additionally or optionally, values of each of the second resistor and the fourth resistor are set by the controller at the onset of the vehicle off condition based on a level of fuel in the fuel tank, the values of each of the second resistor and the fourth resistor increasing with a decrease in the level of fuel in the fuel tank. In any or all of the preceding examples, additionally or optionally, the outputs of each of the first operational amplifier and the second operational amplifier are configured as inputs to an OR logic gate, and an output of the OR logic gate is configured as an input to an edge detector circuit. In any or all of the preceding examples, additionally or optionally, the edge detector circuit includes an exclusive OR (XOR) logic gate, and wherein the RV receives an output of the edge detector circuit. In any or all of the preceding examples, additionally or optionally, the estimated cooling of the fuel corresponds to a sunset detected based on an increase in solar radiance as estimated the first solar cell, and wherein the estimated warming of the fuel corresponds to a sunrise as estimated based on output of the second solar cell.

In another example, a method for an engine in a vehicle, comprises: during a vehicle off condition, in response to detection of sunset via a first solar cell, pulsing a refueling valve (RV) coupling a fuel tank to a fuel vapor canister of an evaporative emissions control system to an open position; and in response to detection of sunrise via a second solar cell, pulsing the RV to a closed position. In the preceding example, additionally or optionally, an output of the first solar cell and an output of the second solar cell are configured as inputs to a comparator circuit, the comparator circuit including one or more operational amplifiers, resistors, variable resistors, and logic gates. In any or all of the preceding examples, additionally or optionally, the resistors include each of a first variable resistor to delay opening the RV by a first duration after sunset, and a second variable resistor to delay closing the RV by a second duration after the sunrise. In any or all of the preceding examples, the method further comprising, additionally or optionally, at initiation of the vehicle off condition, setting a first value of the first variable resistor and setting a second value of the second variable resistor based on a fuel level in the fuel tank. In any or all of the preceding examples, additionally or optionally, the comparator circuit is activated by a controller at the initiation of the vehicle off condition based on a higher than threshold fuel vapor load in the fuel vapor canister, the controller maintained inactive during operation of the comparator circuit during the vehicle off condition.

In yet another example, a system for an engine in a vehicle, comprises: a controller with computer-readable instructions stored on non-transitory memory that when executed cause the controller to: in response to a request for a vehicle off, estimate a load in a fuel vapor canister of an evaporative emissions control system, and in response to a higher than threshold load in the fuel vapor canister, activate a comparator circuit to open a refueling valve (RV) regulating flow of fuel vapor between a fuel tank and the fuel vapor canister in response to a decrease in solar radiance as detected via a first solar cell configured on a surface of the vehicle. In the preceding example, additionally or optionally, a time of opening the RV upon detection of the decrease in solar radiance is based on a fuel level in the fuel tank at vehicle off, and wherein upon opening of RV, air is drawn into the fuel tank via a vent line and the fuel vapor canister, the air desorbing fuel vapor from the canister and routing the desorbed fuel vapor to the fuel tank. In any or all of the preceding examples, additionally or optionally, the comparator circuit closes the RV upon an increase in solar radiance as detected via a second solar cell configures on the surface, a time of closing the RV upon detection of the increase in solar radiance based on the fuel level in the fuel tank; and wherein the opening and the closing of the RV occurs without waking up the controller.

Note that the example control and estimation routines included herein can be used with various engine and/or vehicle system configurations. The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations, and/or functions may be repeatedly performed depending on the particular strategy being used. Further, the described actions, operations, and/or functions may graphically represent code to be programmed into non-transitory memory of the computer readable storage medium in the engine control system, where the described actions are carried out by executing the instructions in a system including the various engine hardware components in combination with the electronic controller.

It will be appreciated that the configurations and routines disclosed herein are exemplary in nature, and that these specific embodiments are not to be considered in a limiting sense, because numerous variations are possible. For example, the above technology can be applied to V-6, I-4, I-6, V-12, opposed 4, and other engine types. Moreover, unless explicitly stated to the contrary, the terms "first," "second," "third," and the like are not intended to denote any order, position, quantity, or importance, but rather are used merely as labels to distinguish one element from another. The subject matter of the present disclosure includes all novel and non-obvious combinations and sub-combinations of the various systems and configurations, and other features, functions, and/or properties disclosed herein.

As used herein, the term "approximately" is construed to mean plus or minus five percent of the range unless otherwise specified.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A method for an engine in a vehicle, comprising:
during a vehicle off condition, in response to an estimated cooling of fuel in a fuel tank, opening a refueling valve (RV) to unseal the fuel tank, the estimated cooling of the fuel based on output of a first solar cell.

2. The method of claim 1, further comprising, in response to an estimated warming of the fuel in the fuel tank, closing the RV to seal the fuel tank, the estimated warming based on output of a second solar cell.

3. The method of claim 1, wherein the RV is coupled to a fuel vapor line regulating flow of fuel vapor between the fuel tank and a canister of an evaporative emissions control (EVAP) system.

4. The method of claim 3, wherein upon opening of the RV, air is drawn into the fuel tank via a vent line and the canister, the air desorbing fuel vapor from the canister and routing the desorbed fuel vapor to the fuel tank.

5. The method of claim 3, wherein the opening of the RV and the closing of the RV is carried out via a comparator circuit activated by a controller at an onset of the vehicle off condition in response to a higher than threshold load in the canister, wherein each of the first solar cell and the second solar cell are configured on an external surface of the vehicle.

6. The method of claim 5, wherein the comparator circuit includes a first operational amplifier configured to receive a first non-inverting input from the second solar cell and a first inverting input from a first voltage source coupled to each of a first resistor and a second resistor in series.

7. The method of claim 6, wherein the comparator circuit further includes a second operational amplifier configured to receive a second non-inverting input from the first solar cell and a second inverting input from a second voltage source coupled to each of a third resistor and a fourth resistor in series.

8. The method of claim 7, wherein each of the second resistor and the fourth resistor are variable resistors, and wherein each of the first resistor and the third resistor are fixed resistors.

9. The method of claim 7, wherein values of each of the second resistor and the fourth resistor are set by the controller at the onset of the vehicle off condition based on a level of fuel in the fuel tank, the values of each of the second resistor and the fourth resistor increasing with a decrease in the level of fuel in the fuel tank.

10. The method of claim 7, wherein outputs of each of the first operational amplifier and the second operational amplifier are configured as inputs to an OR logic gate, and an output of the OR logic gate is configured as an input to an edge detector circuit.

11. The method of claim 10, wherein the edge detector circuit includes an exclusive OR (XOR) logic gate, and wherein the RV receives an output of the edge detector circuit.

12. The method of claim 2, wherein the estimated cooling of the fuel corresponds to a sunset detected based on an increase in solar radiance as estimated the first solar cell, and wherein the estimated warming of the fuel corresponds to a sunrise as estimated based on output of the second solar cell.

13. A method for an engine, comprising:
during a vehicle off condition,
in response to detection of sunset via a first solar cell, pulsing a refueling valve (RV) coupling a fuel tank to a fuel vapor canister of an evaporative emissions control system to an open position; and
in response to detection of sunrise via a second solar cell, pulsing the RV to a closed position.

14. The method of claim 13, wherein an output of the first solar cell and an output of the second solar cell are configured as inputs to a comparator circuit, the comparator circuit including one or more operational amplifiers, resistors, variable resistors, and logic gates.

15. The method of claim 14, wherein the resistors include each of a first variable resistor to delay opening the RV by a first duration after sunset, and a second variable resistor to delay closing the RV by a second duration after the sunrise.

16. The method of claim 15, further comprising, at initiation of the vehicle off condition, setting a first value of the first variable resistor and setting a second value of the second variable resistor based on a fuel level in the fuel tank.

17. The method of claim 16, wherein the comparator circuit is activated by a controller at the initiation of the vehicle off condition based on a higher than threshold fuel vapor load in the fuel vapor canister, the controller maintained inactive during operation of the comparator circuit during the vehicle off condition.

18. A system for an engine in a vehicle, comprising:
a controller with computer-readable instructions stored on non-transitory memory that when executed cause the controller to:
in response to a request for a vehicle off,
estimate a load in a fuel vapor canister of an evaporative emissions control system; and
in response to a higher than threshold load in the fuel vapor canister,
activate a comparator circuit to open a refueling valve (RV) regulating flow of fuel vapor between a fuel tank and the fuel vapor canister in response to a decrease in solar radiance as detected via a first solar cell configured on a surface of the vehicle.

19. The system of claim 18, wherein a time of opening the RV upon detection of the decrease in solar radiance is based on a fuel level in the fuel tank at vehicle off, and wherein upon opening of RV, air is drawn into the fuel tank via a vent line and the fuel vapor canister, the air desorbing fuel vapor from the canister and routing the desorbed fuel vapor to the fuel tank.

20. The system of claim 19, wherein the comparator circuit closes the RV upon an increase in solar radiance as detected via a second solar cell configures on the surface, a time of closing the RV upon detection of the increase in solar radiance based on the fuel level in the fuel tank; and wherein the opening and the closing of the RV occurs without waking up the controller.

* * * * *